United States Patent [19]

Nhu

[11] Patent Number: 4,975,602
[45] Date of Patent: Dec. 4, 1990

[54] LOGIC LEVEL DATA CONVERSION SYSTEM

[75] Inventor: David H. C. Nhu, Gaithersburg, Md.

[73] Assignee: The United States of America as represented by the Secretary of the Navy, Washington, D.C.

[21] Appl. No.: 483,688

[22] Filed: Feb. 23, 1990

[51] Int. Cl.⁵ ..................... H03K 5/08; H03K 19/092
[52] U.S. Cl. ................................. 307/475; 307/465; 307/264; 324/73.1
[58] Field of Search ...................... 307/475, 465, 264; 324/158 R, 73.1

[56] References Cited

U.S. PATENT DOCUMENTS

| | | | |
|---|---|---|---|
| 4,465,971 | 8/1984 | Abeyta | 307/475 |
| 4,527,079 | 7/1985 | Thompson | 307/475 |
| 4,719,459 | 1/1988 | Kovacs | 324/73.1 |
| 4,791,312 | 12/1988 | Weick | 307/264 |
| 4,829,237 | 5/1989 | Segawa | 324/158 R |

Primary Examiner—David Hudspeth
Assistant Examiner—Andrew B. Sanders
Attorney, Agent, or Firm—Kenneth E. Walden; Jacob Shuster

[57] ABSTRACT

Interfacing of different logic level devices is effected through a multi-logic level converter under selective control of an assembly of coupler connectors enabling different logic level voltage conversions and operational monitoring of the converter.

10 Claims, 3 Drawing Sheets

LOGIC LEVEL DATA CONVERSION SYSTEM

BACKGROUND OF THE INVENTION

This invention relates generally to the conversion of multi-bit data between different logic voltage levels.

Converters for interfacing electronic data handling devices operating under different logic voltage levels, are well known, including those which interface positive and negative voltage logic levels as well as transistor-to-transistor (TTL), emitter-coupled (ECL) and complementary metal oxide semiconductor (CMOS) logic levels. Most of such prior art converters are limited to conversions between two different logic level data devices, although U.S. Pat. No. 4,697,109 to Honma et al. discloses circuitry for handling data conversions between three different types of logic levels (TTL, ECL and CMOS). Such prior art data conversion systems are accordingly limited in use.

It is therefore an important object of the present invention to provide a multi-bit data interfacing system having a substantially enlarged data conversion capability for testing different electronic integrated circuits of computers and other electronic equipment in a more efficient and less time consuming manner.

SUMMARY OF THE INVENTION

A plurality electronic data handling devices operating under different logic levels, including NTDS, TTL, ECL and CMOS logics, are interconnected through a multi-connector coupler to a converter formed by a plurality of series connected, driver-receiver circuits through which the different logic level conversions are performed under selective control of the coupler. Test equipment and logic analyzers are also interfaced with the converter through the coupler to perform testing and monitoring functions with respect to multi-bit data under the different logic voltage levels.

BRIEF DESCRIPTION OF THE DRAWING FIGURES

Other objects, advantages and novel features of the invention will become apparent from the following detailed description of the invention when considered in conjunction with the accompanying drawing wherein.

DETAILED DESCRIPTION OF THE PREFERRED EMBODIMENTS

Figures 1, 4:
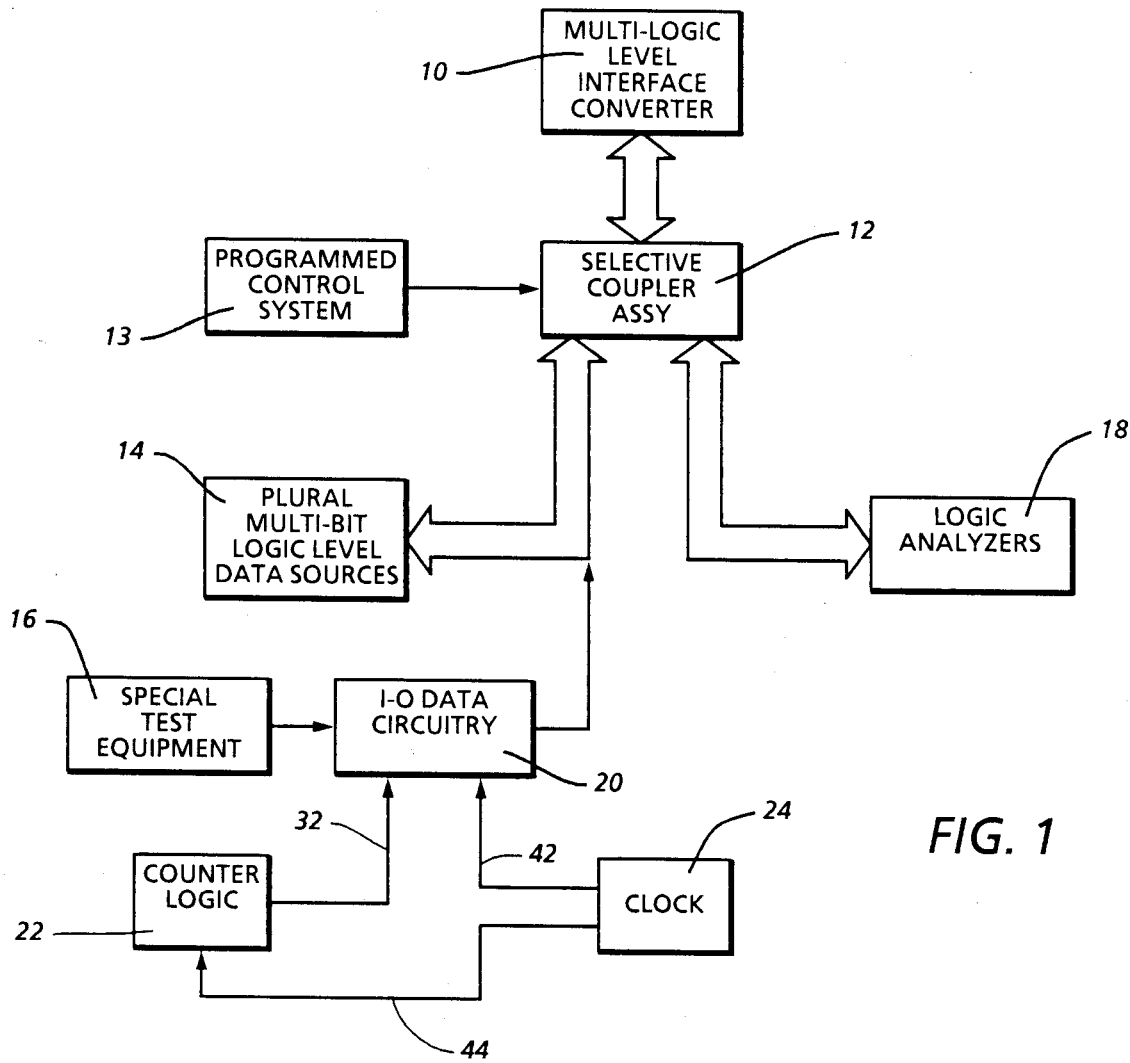
FIG. 1 is a block diagram schematically illustrating the data conversion system of the present invention.
FIG. 4 is a coupler conversion table chart corresponding to the arrangement shown in FIG. 3.

Referring now to the drawing in detail, FIG. 1 diagrammatically illustrates a multi-logic level interface converter 10 associated with a selective coupler assembly 12 which may be operated by a programmed control system 13 in accordance with the present invention.

The converter 10 is operative through coupler 12 to interface a plurality of data sources 14 by conversion between different logic level voltages. The data sources 14 include a Navy tactical data system (NTDS), transistor-to-transistor logic (TTL) devices, emitter-coupled logic (ECL) devices and complementary metal oxide semiconductor (CMOS) devices. The converter 10 may also be utilized to monitor the outputs of such logic level devices or have its own circuitry monitored through logic analyzers 18 as well as to enable the monitoring of special test equipment 16 providing real-time simulation for intraelement interfaces of military or naval hardware. Associated with the test equipment 16 is a trouble shooting I/O data circuitry 20 operatively connecting the test equipment 16 to the coupler 12.

Figure 2:
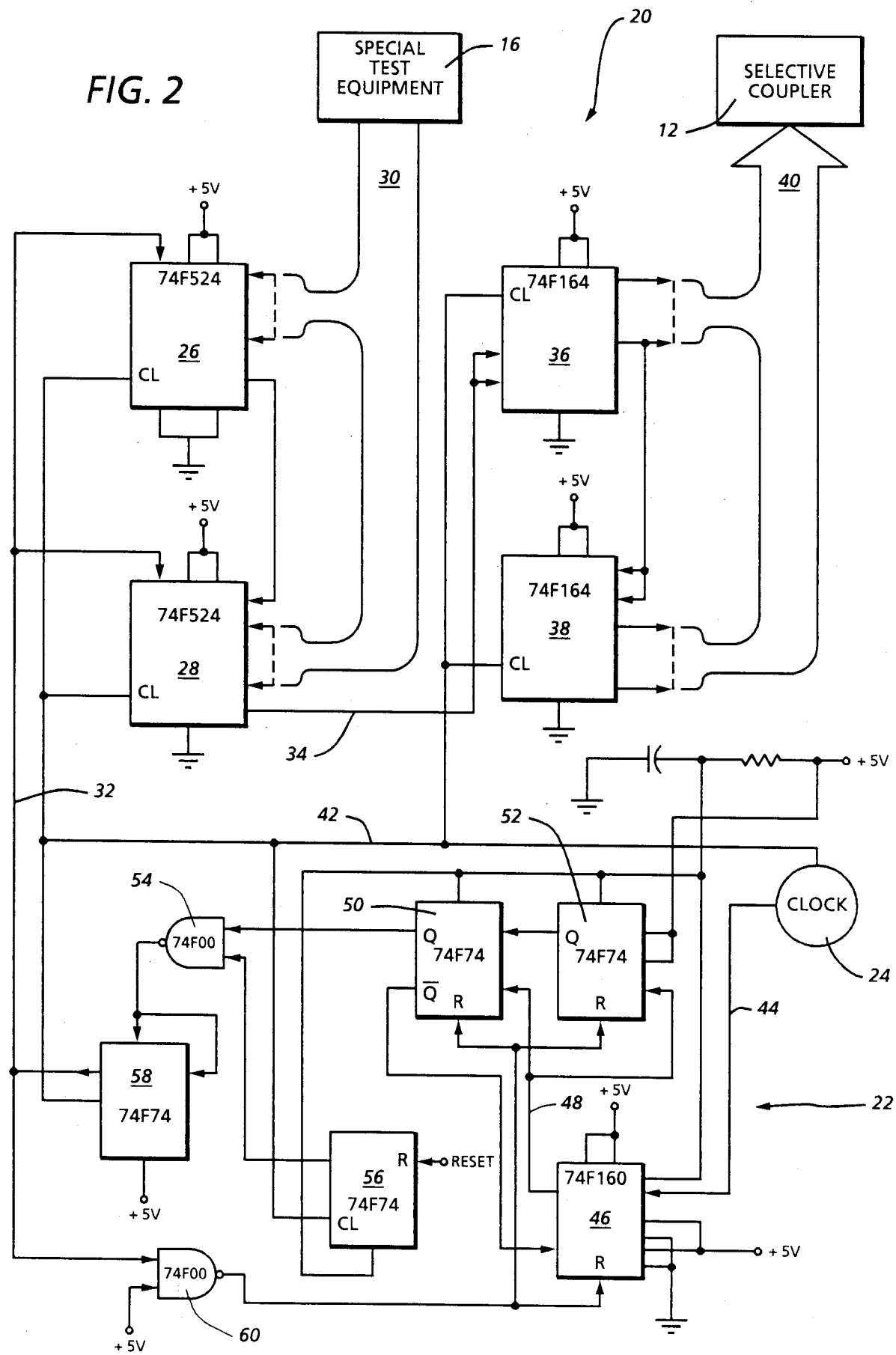
FIG. 2 is a more detailed circuit diagram of the interfacing arrangement associated with special test equipment as diagramed in FIG. 1.

The performance of the I/O data circuitry 20 is controlled by counter logic 22 and clock 24 as diagramed in FIG. 1 and illustrated with greater detail in FIG. 2. As shown in FIG. 2, the 16-bit parallel data output of the test equipment 16 is loaded into a pair of series connected shift registers 26 and 28 through data bus 30 when enabled by signals in line 32 from the counter logic 22. The parallel loaded data is then converted into 16-bit serial data fed by line 34 from shift register 28 to shift registers 36 and 38 of circuitry 20 from which 16-bit parallel data is fed by output data bus 40 through selective coupler 12 to the converter 10.

The enabling pulse signals in line 32 are fed to the shift registers 26 and 28 as shown in FIG. 2, when the clock signals in lines 42 and 44 from the clock 24 is within a frequency range of 1 KHz to 75 MHz. The clock signals in line 44 are fed to the input terminal of counter 46 of the counter logic 22, from which an output count signal is fed by line 48 to a pair of series connected flip-flops 50 and 52. The Q output of flip-flop 50 is fed to one input terminal of NAND gate 54, the other input terminal of which is connected to the output terminal of resettable flip-flop 56 driven by the clock signal in line 42. The output of NAND gate 54 is applied to the input terminal of flip-flop 58 from which the enable signal in line 32 is obtained. The enable signal is applied to shift registers 26 and 28 as aforementioned and through gate 60 is applied as a reset signal to the counter 46 and the flip-flops 50 and 52.

Figure 3:
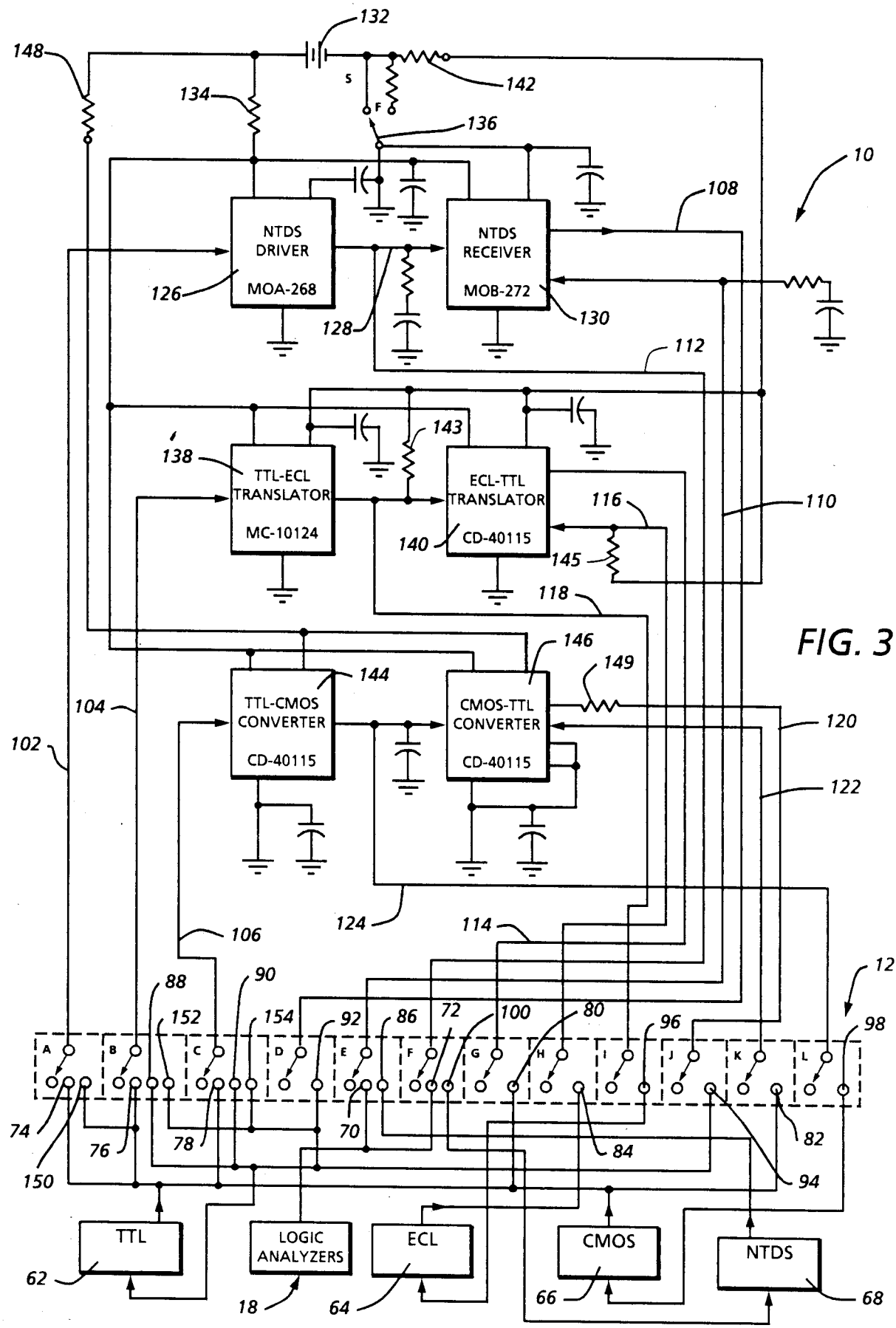
FIG. 3 is a circuit diagram of the converter and coupler assembly shown in FIG. 1.

Referring now to FIG. 3, the converter 10 is shown in detail operatively connected through the selective coupler 12 to data sources 14 and 20, as hereinbefore referred to, having four different logic levels TTL, ECL, CMOS and NTDS. Such logic levels are respectively denoted at terminals 62, 64, 66 and 68 of the coupler 12. The logic analyzers 18 are also connected to the selective coupler 12 through active switch contacts 70 and 72 of its connectors 12E and 12F, respectively, in order to supply and receive logic level data for analysis. All TTL inputs from terminal 62 are connected to active switch contacts 74, 76, 78, 80 and 82 of connectors 12A, 12B, 12C, 12G and 12K, respectively. The ECL inputs from terminal 64 are connected to active switch contact 84 of connector 12F. The CMOS inputs from terminal 66 are connected to the same active switch contacts 74, 76, 78, 80 and 82 as the TTL inputs from terminal 62. The NTDS inputs from terminal 68 are connected to active switch contact 86 of connector 12E. The TTL data outputs to terminal 62 are fed from contacts 88, 90, 92 and 94 of the connectors 12B, 12C, 12D and 12J, respectively, while the ECL outputs to terminal 64 are fed from active switch contact 96 of connector 12J. The CMOS outputs to terminal 66 are fed from contact 98 of connector 12L. Finally, the NTDS outputs to terminal 68 are fed thereto from active contact 100 of connector 12F of the coupler 12 as shown in FIG. 3.

By virtue of the foregoing described arrangement of the selective coupler 12, the interface converter 10 may be controllably programmed through control system 13, as diagrammed in FIG. 1 to perform many different logic level conversions in response to displacement or activation of switch elements of the respective connectors 12A–12L between their inactive positions as shown in FIG. 3 and active contact positions, or some electronically equivalent action. The displaceable switch elements of the connectors 12A–12L are therefore electrically connected to the interface converter 10 by lines 102, 104, 106, 108, 110, 112, 114, 118, 120, 122 and 124, respectively.

With continued reference to FIG. 3, the interface converter 10 includes a driven circuit 126 for receiving positive logic level input signals through line 102 converted to negative logic level output in line 128 fed to receive circuit 130 and through line 112 to the connector 12F of the selective coupler 12. Such driver and receiver circuits for converting logic level signals of the NTDS type are already well known, as disclosed for example in U.S. Pat. No. 4,044,271 to Symanski et al. In the embodiment illustrated in FIG. 3, the NTDS driver circuit 126 is energized by a power source 132 at a positive potential through resistor 134 and at a selected negative potential through switch 136. The NTDS receiver circuit 130 is similarly energized to supply converted positive logic signals through line 108 to the connector 12D of selective coupler 12.

The positive volt potential from power source 132 reduced by resistor 134 is also supplied to translator driver 138 and receiver 140 interconnected in series as shown in FIG. 3, while a negative potential reduced by resistor 142 is supplied thereto through voltage dropping resistors 143 and 145. TTL inputs are fed through line 104 from coupler connector 12B to the translator 138 while TTL to ECL converted outputs therefrom are supplied to connector 12I of the coupler 12 through line 118. The ECL to TTL converted outputs of translator circuit 140 on the other hand are supplied to connector 12G through line 114. The TTL to ECL type translator circuit 138 is generally known in the art, as disclosed for example in U.S. Pat. No. 4,806,800 to Khau. The ECL to TTL type translator circuit 140 is also generally known, as disclosed in U.S. Pat. No. 3,986,045 to Lutz by way of example. An ECL input is also fed to the translator 140 through connector 12H of the couple 12 and line 116, as shown, for conversion to the TTL output in line 114.

Finally, the interface converter 10 includes interface level converting driver 144 and receiver 146 interconnected in series, to which a +5 volt potential is supplied through resistor 134. A +12 volt potential is also supplied through resistor 148 to both of the converters 144 and 146. TTL inputs are fed to converter 144 from coupler connector 12C through line 106 while converted CMOS outputs are fed therefrom to converter 146 and through line 124 to coupler connector 12L. The converter receiver 146 also receives CMOS inputs through line 122 from the coupler connector 12K while converted TTL outputs are fed through coupling resistor 149 and line 120 to coupler connector 12J. The TTL to CMOS and CMOS to TTL types converter circuits 144 and 146 are generally known in the art as disclosed for example in U.S. Pat. No. 4,472,647 to Allgood et al.

The different conversion and trouble shooting capabilities of the interface converter 10 as hereinbefore described, are tabulated in FIG. 4, based on the described arrangements of and the diagramed interconnections between the converter 10 and the connectors 12A–12L of coupler 12. It will be apparent from the foregoing that through coupler connector 12A, 16-bit TTL input data from terminal 62 is converted into 16-bit NTDS output data by driver 126 of the converter 10, fed to connector 12F as indicated by conversion (1) in the table of FIG. 4. Such converted NTDS data is also converted back to TTL output data fed to coupler connector 12D as indicated by table conversion (2) of FIG. 4. The 16-bit NTDS input data at terminal 68 supplied to coupler connector 12E is also converted by the NTDS receiver 130 to TTL output data fed to connector 12D as reflected by conversion (3) in the table of FIG. 4. the TTL input data at terminal 62 supplied to connector 12A as aforementioned in connection with tabulated conversions (1) and (2), is also supplied to connectors 12B and 12C to respectfully establish conversions (4) and (5) and as tabulated in FIG. 4. Such TTL input data may thereby be converted into ECL output data by translator 138 fed to connector 12I as tabulated conversion (4) or converted into CMOS output data by converter 144 fed to connector 12L as conversion (5). ECL inputs received through terminal 64 by connector 12H undergo ECL to TTL conversion (6) within translator 140 fed as TTL outputs to connector 12G, while CMOS inputs received through terminal 66 at connector 12K undergo conversion (7) to TTL outputs fed to connector 12J.

As shown in FIG. 3, the logic analyzers 18 are connected to contacts 70 and 72 of connectors 12E and 12F, respectively. Data for trouble shooting purposes is thereby fed from connector 12E through line 110 to the NTDS receiver 130 or received from NTDS driver 126 through connector 12F and line 112. Also, because of the connections 12B, 12C, 12D and 12J, the connection of connector 12B through contact 152 to connector 12D and 12J, and the connection of connector 12C through contact 154 to connectors 12B, 12D and 12J, I/O data trouble shooting analyses may be performed at connectors 12A, 12B, 12C, 12D, 12G and 12J as indicated by conversion (8) in the table of FIG. 4.

Numerous modifications and variations of the present invention are possible in light of the foregoing teachings. It is therefore to be understood that within the scope of the appended claims the invention may be practiced otherwise than as specifically described.

What is claimed is:

1. In a system for interfacing and monitoring a plurality of logic level devices, a converter assembly including first means for shifting between positive and negative logic levels, second means for shifting between transistor-to-transistor logic levels and emitter-coupled logic levels and third means for shifting between transistor-to-transistor logic levels and complementary metal oxide semiconductor logic levels, and coupler means operatively interfacing the logic level devices through said converter assembly for selective conversions between the positive, negative, transistor-to-transistor, emitter-coupled and complementary metal oxide semiconductor logic levels.

2. The system as defined in claim 1 wherein each of said first, second and third means of the converter assembly includes driver and receiver circuits, means interconnecting said circuits in series, a pair of input terminals respectively connected to the driver and receiver circuits and a pair of output terminals respectively connected to the series interconnecting means and the receiver circuit.

3. The system as defined in claim 2 wherein the coupler means includes a plurality of connectors respectively including switch elements connected to the input and output terminals of the converter assembly and contacts selectively engageable by the switch elements, said contacts being respectively connected to one or more of the logic level devices.

4. The system as defined in claim 3 including logic analyzing means connected to the contacts of at least two of the connectors for selective connection to the input terminals of the receiver circuit and the series interconnecting means of the first means in the converter assembly.

5. The system as defined in claim 4 wherein one of the logic level devices includes a testing source of logic level input data and data circuit means operatively interfacing said source and the coupler means for limiting supply of the input data to a predetermined frequency range.

6. The system as defined in claim 1 wherein one of the logic level devices includes a testing source of logic level input data and data circuit means operatively interfacing said source and the coupler means for limiting supply of the input data to a predetermined frequency range.

7. The system as defined in claim 1 wherein the coupler means includes a plurality of connectors interconnecting different combinations of the first, second and third means of the converter assembly with the logic level devices.

8. The system as defined in claim 7 including logic analyzing means connected to at least two of the connectors for selective connection to the first means of the converter assembly.

9. In a system for interfacing logic level devices, a plurality of converting means for respectively shifting between different pairs of logic level voltages, coupler means operatively interconnecting the logic level devices through the converting means for selective conversions between the different pairs of the logic level voltages and logic analyzer means connected to the coupler means for selectively monitoring operation of the converting means.

10. The system as defined in claim 9 wherein one of the logic level devices includes a testing source of logic level input data and data circuit means operatively interfacing said source and the coupler means for limiting supply of the input data to a predetermined frequency range.

* * * * *